(12) United States Patent
Maes

(10) Patent No.: US 10,542,637 B2
(45) Date of Patent: Jan. 21, 2020

(54) THERMAL CONDUCTIVE LIQUID DISPLAY SYSTEM

(71) Applicant: Marcel Peter Gerard Maes, Simpelveld (NL)

(72) Inventor: Marcel Peter Gerard Maes, Simpelveld (NL)

(73) Assignee: PERMIUM ELECTRONIC CO. LTD, Kwai Chung (HK)

(*) Notice: Subject to any disclaimer, the term of this patent is extended or adjusted under 35 U.S.C. 154(b) by 637 days.

(21) Appl. No.: 14/650,719

(22) PCT Filed: Dec. 17, 2013

(86) PCT No.: PCT/EP2013/076995
§ 371 (c)(1),
(2) Date: Jun. 9, 2015

(87) PCT Pub. No.: WO2014/095935
PCT Pub. Date: Jun. 26, 2014

(65) Prior Publication Data
US 2015/0327401 A1 Nov. 12, 2015

(30) Foreign Application Priority Data

Dec. 19, 2012 (EP) .................................... 12198221
Jan. 25, 2013 (EP) .................................... 13152626

(51) Int. Cl.
*H05K 7/20* (2006.01)
*H05K 5/00* (2006.01)
*H05K 5/06* (2006.01)
*G02F 1/1333* (2006.01)
*G02F 1/1335* (2006.01)

(52) U.S. Cl.
CPC ... *H05K 7/20281* (2013.01); *G02F 1/133382* (2013.01); *G02F 1/133385* (2013.01); *H05K 5/0017* (2013.01); *H05K 5/06* (2013.01); *G02F 2001/133628* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,256,083 | B1 * | 7/2001 | Numata | G02F 1/133385 348/E5.141 |
| 8,902,607 | B1 * | 12/2014 | Chang | G01R 31/2834 349/57 |
| 2007/0081344 | A1 * | 4/2007 | Cappaert | G02B 6/0085 362/373 |
| 2008/0225188 | A1 | 9/2008 | Hoshino | |
| (Continued) | | | | |

FOREIGN PATENT DOCUMENTS

CA 2624739 A1 9/2009

*Primary Examiner* — Lauren Nguyen
(74) *Attorney, Agent, or Firm* — David Guerra

(57) ABSTRACT

A display apparatus comprises a thermal conductive liquid (46) in a liquid tight encasing (11) which has a transparent window (13). A direct view display panel (12) with a front area for displaying information is arranged inside the liquid tight encasing (11) in a position with respect to the transparent window (13) such that the information is viewable through the transparent window (13). The direct view display panel (12) is submerged in the thermal conductive liquid (46).

20 Claims, 2 Drawing Sheets

(56) References Cited

U.S. PATENT DOCUMENTS

2010/0302728 A1* 12/2010 Knaup ............... H05K 7/20918
                                                        361/690
2012/0255721 A1    10/2012 Kim et al.

* cited by examiner

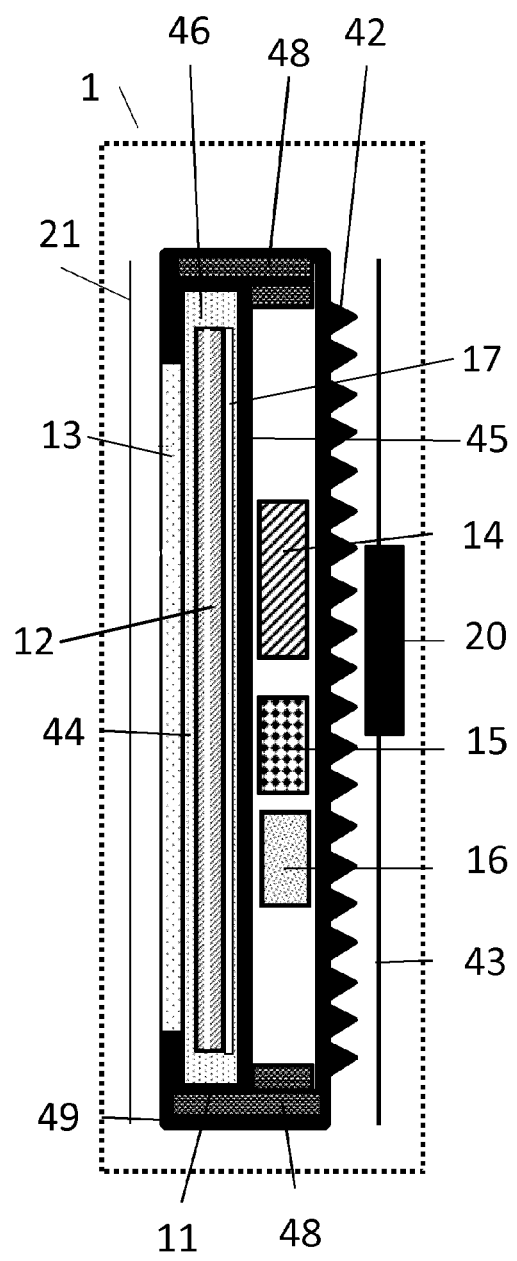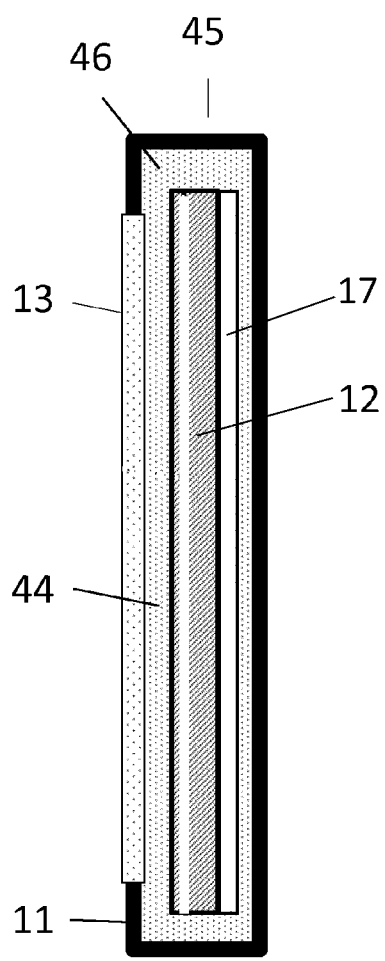
Fig. 1A
Fig. 1B

THERMAL CONDUCTIVE LIQUID DISPLAY SYSTEM

CROSS-REFERENCE TO RELATED APPLICATIONS

This application is an U.S. national phase application under 35 U.S.C. § 371 based upon co-pending International Application No. PCT/EP2013/076995 filed on Dec. 17, 2013. Additionally, this U.S. national phase application claims the benefit of priority of co-pending International Application No. PCT/EP2013/076995 filed on Dec. 17, 2013, European Application No. 12198221.9 filed on Dec. 19, 2012, and European Application No. 13152626.1 filed on Jan. 25, 2013. The entire disclosures of the prior applications are incorporated herein by reference. The international application was published on Jun. 26, 2014 under Publication No. WO 2014/095935 A1.

FIELD OF THE INVENTION

The invention relates to a display apparatus, a digital outdoor advertising system which comprises the display apparatus and a passenger information system which comprises the display apparatus.

BACKGROUND OF THE INVENTION

US2012/0255721 discloses an outdoor display apparatus which has an improved configuration to effectively prevent deterioration of a panel included therein. The outdoor display apparatus includes: a casing body having an air inlet and an air outlet, first and second display panel modules in the casing body to display images on front and rear surfaces of the casing body, respectively, transparent members fitted respectively to the front surface and the rear surface of the casing body to protect the first and second display panel modules, an air suction unit which comprises a fan to suction the air into the casing body through the inlet via an air filter and to discharge the air through the outlet, and an air distribution unit to distribute the air discharged from the air suction unit to at least one of the first display module and the second display module.

Such an outdoor display apparatus requires regular maintenance because the air filters have to be cleaned or replaced and the inside transparent members have to be cleaned occasionally. The maintenance of an outdoor display apparatus is very costly. The air space between the transparent member and the display panel causes poor visibility from light reflection and possible contamination by foreign particles and will reduced the view angle. Further, the fans will consume electrical power and generate noise. The apparatus will face internal moisture condensation if the ambient temperature is around zero degrees Celsius and even frost damage to the display panel glass layers especially if the apparatus is not powered at night to save electricity. The apparatus requires continuous operation or even heating and thus will have a high power consumption. In public places the transparent members are vulnerable to vandalism, this potential damage risk maybe reduced by increasing the thickness and laminating the transparent members, the glass will be costly, heavy and will significantly attenuate the light output of the display device so decreases the visibility in daytime. The whole construction is quite bulky.

SUMMARY OF THE INVENTION

It is an object of the invention to provide a display apparatus which has at least one of the following advantages: the display apparatus does not require regular maintenance, has improved visibility under all weather conditions, does not have to be powered 24 hours a day, has no risk for frost damage, has a lower power consumption (is a 'Green Design'), is less vulnerable to vandalism, produces less noise, is less bulky, has a longer lifespan, has an improved Mean Time Between Failures and lower Total Cost of Ownership.

A first aspect of the invention provides a display apparatus as claimed in claim 1. A second aspect of the invention provides an outdoor advertising system as claimed in claim 12. A third aspect of the invention provides a passenger information system (PIDS) comprising the display apparatus as is claimed in claim 13. Advantageous embodiments are defined in the dependent claims.

A display apparatus in accordance with the first aspect of the invention comprises a liquid tight encasing in which a direct view display panel is arranged.

The liquid tight encasing is filled with a thermal conductive liquid such that the direct view display panel is submerged in the liquid. The liquid tight encasing comprises a transparent window to enable a spectator to see a front area of the direct view display panel through the transparent window. The front area of the direct view display panel is the area where the information is displayed. The information displayed may be any kind of information to be conveyed to the spectator, for example a static picture, a series of pictures, a movie or any other moving information, text, departure and arrival time of public transportation vehicles, scrolling advertisements, public addressed government messages or any combination thereof.

The claimed display apparatus provides at least one of the following advantages.

The use of the liquid tight encasing prevents any dust or moisture to enter the system. Moisture will especially occur in colder climates in non-heated housings to save electricity at night, it will corrode the electric parts and may enter the delicate display glass layers causing frost fatal cracks and the moisture will appear as fog on the transparent window making the apparatus useless under these circumstances.

The thermal conductive liquid conducts the heat generated by components present in the liquid tight encasing to the wall or walls of the liquid tight encasing which dissipates the heat into the ambient. For example, the thermal conductive liquid may be a mineral oil or silicon oil. The fan and the air inlet and outlet are superfluous and thus a very compact construction may be obtained. In an embodiment, the wall or walls of the liquid tight encasing have a high thermal conductivity. For example, this wall or these walls are made of metal. The wall or walls may have protrusions at the inner side (in the thermal conductive liquid) or at the outer side (for example, in the ambient air) or both to improve the heat transfer from the thermal conductive liquid to the ambient of the liquid tight encasing.

The liquid cooled backlight may run at a much lower temperature than by (forced) air cooling. This lower temperature will boost the lifespan of the backlight elements or can be used to increase the backlight current to achieve higher display brightness without adding backlight elements.

The liquid absorbs impacts, shocks, vibration from outside like vandalism attacks, collisions, and vehicle motion.

The protective transparent window can be thinner or non-laminated and consequently the brightness and visibility of the displayed information will improve at the same power consumption. The transparent window does not need an antireflective surface at the inside which produces diffuse scattered light and reduces the brightness. The invention will reduce the cost of the window and increase the brightness, visibility further.

The liquid absorbs the UV light from the sun and thus protects and enlarges the lifespan of the display The liquid effectively transports the absorbed heat from the sun from the delicate front side to the cool sides and the back of the apparatus. Without forced air cooling or the new emerged liquid cooling the temperature in the enclosure may reach 90 degrees Celsius because of a greenhouse effect and self-heating of the electronics causing overheating and permanent damage to most standard display panel modules.

In an embodiment, the liquid tight encasing is completely filled with the thermal conductive liquid and does not contain any air. The lack of air inside the apparatus and the tight enclosure will prevent sparks making the product suitable for explosion proof applications like required in the oil and gas industry.

In an embodiment of the invention, at least a subset of the electronic circuits required to operate the direct view display panel is arranged inside the fluid tight encasing and is submerged in the liquid. Now the liquid is also cooling the submerged electronic circuits. The liquid may be electrically non-conductive. Alternatively, the electronic circuits may be sealed such that the liquid need not be non-conductive. Such a sealing should be thermal conductive. The submerging of the electronic circuits has the advantage that the cooling of the electronic circuits does not need any other cooling system than the already present one for the direct view display panel. Also for the electronic circuits there is no need to add a fan and air filter.

In an embodiment of the invention relevant for mains operated apparatuses, the electronic circuits comprise a processing circuit for driving the direct view display panel and an AC to DC power converter for converting the AC-mains voltage into power supply voltages for the display processing circuit.

In an embodiment of the invention relevant for battery operated apparatuses, the electronic circuits comprise a battery, a processing circuit for driving the direct view apparatus and a DC to DC power converter for converting a DC-voltage supplied the battery into power supply voltages for the processing circuit. Independent on whether the apparatus is mains or battery operated, all the components may be submerged in the liquid within the liquid tight encasing such that a single cooling system suffices.

In an embodiment of the invention, the front area of the direct view display panel is spaced apart from the transparent window for allowing the liquid to flow between the front area and the transparent window. This allows cooling the display panel also at the front area.

In an embodiment of the invention, a refractive index of the liquid, a refractive index of a material of the transparent window and a refractive index of a transparent material covering the front area of the direct view display panel are matched. The matched refractive indices have the advantage that minimal reflections occur in the optical path under all view angles resulting in a high brightness and thus improved visibility. In a prior art technique the display panel and the transparent window are bounded with an optical matched permanent glue. This known technique is technically complicated and costly. A further disadvantage of the known technique is that the window and display panel can never be separated, a broken window always means a broken display. The invention will save the cost of manufacture and the cost of operation because the window (and the liquid within) can still be replaced in the field.

In an embodiment of the invention, the liquid tight encasing comprises a heat sink area for dissipating heat into the ambient of the liquid tight encasing. Such a heat sink area may be integrally formed with a wall of the liquid tight encasing or may be a separate heat sink mounted on a wall of the liquid tight encasing.

In an embodiment of the invention, a liquid pump may be arranged inside the liquid tight encasing to improve a liquid flow inside the liquid tight encasing.

These and other aspects of the invention are apparent from and will be elucidated with reference to the embodiments described hereinafter.

BRIEF DESCRIPTION OF THE DRAWINGS

In the drawings:
FIGS. 1A and 1B schematically show a first embodiment in accordance with the present invention, and
FIG. 2 schematically shows a second embodiment in accordance with the present invention.

Figure 2:
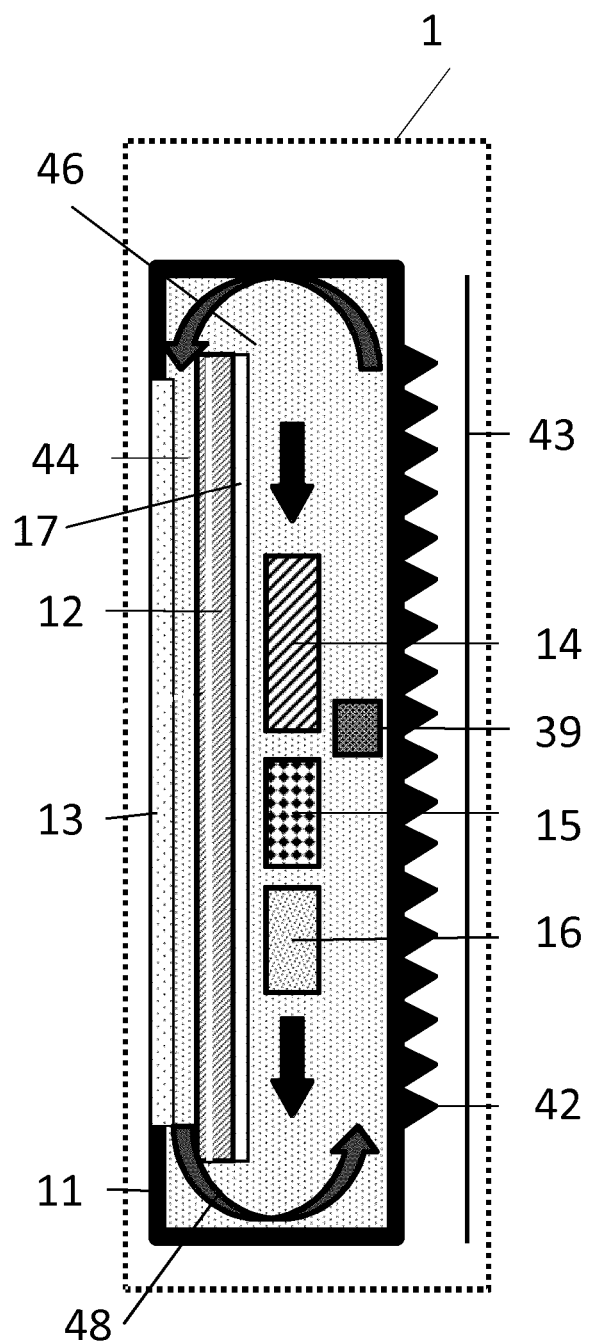

It should be noted that items which have the same reference numbers in different Figures, have the same structural features and the same functions, or are the same signals. Where the function and/or structure of such an item has been explained, there is no necessity for repeated explanation thereof in the detailed description.

DETAILED DESCRIPTION

FIGS. 1A and 1B schematically show a first embodiment in accordance with the present invention. FIG. 1A shows a display apparatus 1 with a module 45. The display apparatus is of the type suitable for direct view of the pixels of the display panel and is not intended to cover projection systems which anyhow are considered too bulky in the context of the present invention. The term direct view display panel therefore indicates that a spectator can directly view the information on the display panel via the transparent window 13.

FIG. 1B shows the module 45 in isolation. The module 45 comprises the liquid tight encasing 11 with the transparent window 13. The liquid tight encasing is filed with a thermal conductive liquid 46. The direct view display panel 12 is arranged inside the liquid tight encasing 11 and is submerged in the thermal conductive liquid 46. It is not essential for the present invention that the thermal conductive liquid 46 is present at all sides of the direct view display panel 12. The walls of the liquid tight encasing 11 may be made of metal. The transparent window 13 may be made of glass or plastic. The direct view display panel 12 may use any suitable direct view display technology, such as for example: LCD, TFT, LCM, LED or OLED. If present, the backlight 17 may be of any suitable type, such as for example: white LED's, colored LED's, CCFL lamps, or TL lamps and may be arranged at any suitable position with respect to the display area, for example at the side, at the corners or at the back of the display panel 12. The display panel may be of the reflective or transmissive type, or a combination thereof.

In FIG. 1A, the module 45 is arranged inside a housing 49 which for example is a metal shell. The part within the dashed line indicated by 1 is referred to as the Electronic Information Display and is in the now following also referred to by the abbreviation EID. The optional support structure 2 may keep the EID in a particular position. The EID may be moveable into a desired direction at the particular position. The EID may be an integral part of another device, for example inside a video camera or may be carried in a mobile device. The EID may be used inside a building, a shelter, a vehicle on land, sea, under water, in the air, outside the earth atmosphere, or may be hand or cloth carried. The liquid tight module 45 seals the direct view display panel 12 from ambient influences such as for example moisture (for example condensation), frost, dirt, explosive and corrosive materials (for example: salt water, chemicals, oil, explosive gas).

The electronic processing circuit 14 drives the display panel 12. The processing circuit 14 may be a standard display controller or may be a suitably programmed embedded computer or a combination of both. The power converter 15 converts the AC mains voltage, or an external DC voltage, or a DC voltage of the optional battery 16 into power supply voltages required by the processing circuit 14. The external DC voltage may originate from a vehicle in which the display apparatus is used. The processing circuit 14 may generate the information to be displayed on the display panel 12 and generates drive signals to drive the display panel 12 such that the information is actually displayed. Alternatively, the processing circuit 14 may receive the information to be displayed from a remote location, for example by internet or any other wired or wireless communication channel.

The optional heat sink 42 is arranged at the back side of the display apparatus and may have protrusions to enlarge the cooling area. The heat sink 42 may be attached to other walls of the display apparatus or to all sides of the display apparatus except the display area. The heat sink 42 may be attached to or may be an integral part of the housing 49. Alternatively, the heat sink 42 may be attached to or may be an integral part of the liquid tight encasing 11. An optional sun shade arrangement 43 may prevent the sun to directly shine on the heat sink 42. The sun shade arrangement may only shield a part of heat sink 42. The sun shade arrangement 43 may have ventilation holes. Optionally the sun shade arrangement 43 may have protrusions extending backwards in horizontal or vertical direction or in an array like manner to prevent the sun to shine through the ventilation holes onto the heat sink 42.

In an embodiment, a gap 44 is present between the inner side of the transparent window 13 and the front side of the display panel 12 such that the thermal conductive liquid 46 is present between the transparent window 13 and the display panel 12. This allows the thermal conductive liquid 46 to flow along the front side of the display panel 12 to cool this front side. The optional heat conductor bridge 48 may be part of the housing 49 and has the function to improve the transport of heat from the liquid tight encasing 11 to the heat sink 42. In an embodiment, the heat conductor bridge 48 is made of solid metal, for example aluminum or may be a heat pipe.

Optionally, a fan 20 may be added to cool the heat sink 42. Optionally, a touch screen 21 may be present in front of the window 13 or may be integrated into the window 13. The touch screen 21 may cover the complete window 13 or only a portion thereof.

FIG. 2 schematically shows a second embodiment in accordance with the present invention. The items which have identical reference signs to the items shown in FIGS. 1A and 1B are not discussed anymore. The difference between the embodiment shown in FIG. 2 and the embodiment shown in FIGS. 1A and 1B is that the housing 49 is now the fluid tight encasing 11. The thermal conductive liquid 46 now fills the complete housing 49 of FIGS. 1A and 1B. Consequently, also the electronic circuits 14, the power converter 15 and the optional battery 16 are embedded in the thermal conductive liquid 46. It is not essential for the present invention that the battery 16 is embedded in the thermal conductive liquid. The term embedded does not indicate that the item should be surrounded at all sides by the liquid 46. An optional liquid pump 39 may be present to improve the flow of the thermal conductive liquid 46 inside the fluid tight encasing 11. The pump may be controlled by a thermostatic switch or an electronic temperature control device. The flow of the thermal conductive liquid 46 is indicated by the arrows 48. This flow may be convection due to the temperature differences in the thermal conductive liquid. The flow may be enlarged by adding the liquid pump 39.

The present invention provides protection against overheating by directly impinging sun light (1000 W per square meter) without requiring expensive maintenance (cleaning 1 to 2 times a year the air filters). Due to the improved cooling, it is further possible to either obtain a longer lifetime or to increase the backlight power without decreasing the lifetime.

The present invention may have many applications in systems where a display is present, some of which are mentioned in the now following: an outdoor digital advertising system; a passenger information system outdoor or inside a vehicle; an ATM or Kiosk display unit; an outdoor mobile display device; a touchscreen of any technology like IR, Resistive, Capacitive; an ultrasound apparatus; any sun or daylight exposed display apparatus; any waterproof display apparatus; any life-support or medical display apparatus; any Aerospace display apparatus; any automotive display apparatus; any professional or consumer AV display apparatus; any military display apparatus; any general transportation, like rail, tram, bus; any indoor application; any marine system; any gaming, casino or entertainment system; any gas station application; any industrial application; any mobile phone or PDA; any digital signaling system: any Point of sale; any payment card reader device; any digital shelf advertising system; any transparent screen comprising the display apparatus; any outdoor monitor system comprising the display apparatus as claimed in any one of the preceding claims. The present invention does not exclude enclosures with additional fans.

It should be noted that the above-mentioned embodiments illustrate rather than limit the invention, and that those skilled in the art will be able to design many alternative embodiments without departing from the scope of the appended claims.

To counteract the volume change of the thermal conductive liquid (for example: oil) at changing temperature, the material of the cabinet may have a compensating temperature coefficient. Alternatively, an expansion volume may be present. Such an expansion volume may be a gas bubble (like air or nitrogen) inside the enclosure, a gas (for example, air) filed pouch floating in the thermal conductive liquid, or may be a volume filed with a gas, which volume is separated from the thermal conductive liquid by a flexible membrane. Alternatively, a piston may be used instead of the membrane. The expansion volume may be completely inside or outside the cabinet or may be present partly inside and partly outside the cabinet. What is important is that any suitable means are present to allow the volume of the thermal conductive liquid to change with changing temperature. In a practical implementation it appeared sufficient to cover a 2% change of the volume of the thermal conductive liquid over the operating temperature range. Alternatively the housing can be (semi) open at the top, (like an aquarium) so the liquid could expand into the ambient atmosphere (gas).

The invention also may be used for optical bonding purposes only with a narrow gap 44. The narrow gap 44 may prevent liquid to flow and cool but may improve the optical performance of an outdoor display such as an outdoor advertising system and a digital outdoor advertising system.

Dependent on the construction of the display panel and if present it's backlighting, care should be taken to liquid tight seal this construction such that the thermal conductive liquid does not alter the optical behavior of the construction. For example in a construction comprising a LCD display panel and a conventional backlighting, the backlighting should be fluid tight sealed to prevent the thermal conductive liquid to enter between the different elements (for example, the diffuser layers) of the backlighting where the thermal conductive liquid would cause a change of the optical properties of the construction. Alternatively, a dedicated backlighting may be used which is designed to be filled with the thermal conductive liquid.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A display system comprising
a module comprising:
   a liquid tight encasing being filled with a thermal conductive liquid, said liquid tight encasing comprising a transparent window; and
   a direct view display panel submerged in said liquid, said direct view display panel having a front area for displaying information and being arranged inside said liquid tight encasing in a position with respect to said transparent window for allowing direct viewing of the information through said transparent window; and
a housing configured as a shell to fully encapsulate said module therein with sand transparent window being in communication with an exterior of said housing.

2. The display system as claimed in claim 1 further comprising a backlight arranged inside said liquid tight encasing so as to be cooled by said liquid, said direct view display panel and said backlight being submerged in said thermal conductive liquid.

3. The display system as claimed in claim 2, wherein a refractive index of said thermal conductive liquid, and a refractive index of a material of said transparent window are matched.

4. The display system as claimed in claim 2 further comprising an embedded temperature control to spread and control trapped ambient heat by circulating said thermal conductive liquid.

5. The display system as claimed in claim 4, wherein said front area of said direct view display panel is spaced apart from said transparent window for allowing said thermal conductive liquid to flow between said front area and said transparent window to allow circulation of said thermal conductive liquid and control of the trapped ambient heat.

6. The display system as claimed in claim 4 further comprising a liquid pump arranged inside said liquid tight encasing and said embedded temperature control for obtaining an increased liquid flow of said thermal conductive liquid inside said liquid tight encasing.

7. The display system as claimed in claim 4 further comprising a sun shade configured to prevent light to directly shine on at least a portion of said heat sink of said embedded temperature control.

8. The display system as claimed in claim 7, wherein said sun shade includes ventilation holes defined therethrough.

9. The display system as claimed in claim 8, wherein said sun shade includes protrusions extending backwards therefrom, said protrusions are configured to prevent light to shine through said ventilation holes onto said heat sink.

10. The display system as claimed in claim 1 further comprising electronic circuits for operating said direct view display panel, said electronic circuits are arranged inside said housing containing said liquid tight encasing.

11. The display system as claimed in claim 1 further comprising a touchscreen adjacent said window exterior or interior of said liquid tight encasing.

12. The display system as claimed in claim 1, wherein a refractive index of said thermal conductive liquid, and a refractive index of a material of said transparent window are matched.

13. The display system as claimed in claim 1 further comprising an embedded temperature control to spread and control trapped ambient heat by circulating said thermal conductive liquid.

14. The display system as claimed in claim 1 further comprising:
   electronic circuits for operating said direct view display panel, said electronic circuits having a location selected from the group consisting of inside said liquid tight encasing and submerged in said thermal conductive liquid, and inside a housing containing said liquid tight encasing; and
   a touchscreen having a location selected from the group consisting of embedded in said liquid tight encasing, and adjacent said window exterior of said liquid tight encasing.

15. The display system as claimed in claim 10, wherein said housing further comprises a heat sink area for dissipating heat into an ambient of said housing.

16. The display system as claimed in claim 15, wherein said housing further comprises at least one heat conductor bridge configured to transport heat from said liquid tight encasing to said heat sink.

17. The display system as claimed in claim 16, wherein said electronic circuits are arranged inside said housing between said liquid tight encasing and said heat sink, and an area of said housing including said electronic circuits is in communication with a portion of said heat conductor bridge.

18. The display system as claimed in claim 17, wherein said electronic circuits include a processing circuit, a power converter, and a battery.

19. The display system as claimed in claim 17 further comprises a fan located exterior and adjacent said heat sink to cool said heat sink.

20. The display system as claimed in claim 17 further comprises a sun shade located exterior and adjacent said heat sink, said sun shade is configured to prevent light to directly shine on at least a portion of said heat sink.

* * * * *

UNITED STATES PATENT AND TRADEMARK OFFICE
CERTIFICATE OF CORRECTION

PATENT NO. : 10,542,637 B2
APPLICATION NO. : 14/650719
DATED : January 21, 2020
INVENTOR(S) : Marcel Peter Gerard Maes Page 1 of 1

It is certified that error appears in the above-identified patent and that said Letters Patent is hereby corrected as shown below:

Column 7, Line 47 (Claim 14, Line 14) change "sand" to --said--.

Signed and Sealed this
Twelfth Day of May, 2020

Andrei Iancu
*Director of the United States Patent and Trademark Office*